(12) United States Patent
Platzgummer et al.

(10) Patent No.: US 7,737,422 B2
(45) Date of Patent: Jun. 15, 2010

(54) CHARGED-PARTICLE EXPOSURE APPARATUS

(75) Inventors: Elmar Platzgummer, Vienna (AT); Stefan Cernusca, Vienna (AT); Gerhard Stengl, Wernberg (AT)

(73) Assignee: IMS Nanofabrication AG, Vienna (AT)

( * ) Notice: Subject to any disclaimer, the term of this patent is extended or adjusted under 35 U.S.C. 154(b) by 271 days.

(21) Appl. No.: 11/816,353

(22) PCT Filed: Feb. 16, 2006

(86) PCT No.: PCT/AT2006/000060

§ 371 (c)(1),
(2), (4) Date: Aug. 15, 2007

(87) PCT Pub. No.: WO2006/086815

PCT Pub. Date: Aug. 24, 2006

(65) Prior Publication Data

US 2008/0258084 A1    Oct. 23, 2008

(30) Foreign Application Priority Data

Feb. 18, 2005    (AT)   ............................ A 273/2005

(51) Int. Cl.
*G21G 5/00* (2006.01)
(52) U.S. Cl. .............. 250/492.3; 250/492.1; 250/492.2; 313/420
(58) Field of Classification Search ........... 250/492.1, 250/492.2, 492.3; 313/420
See application file for complete search history.

(56) References Cited

U.S. PATENT DOCUMENTS

| 3,624,391 | A | 11/1971 | Davison |
| 4,985,634 | A | 1/1991 | Stengl et al. |
| 6,326,632 | B1 | 12/2001 | Buschbeck et al. |
| 2003/0155534 | A1 | 8/2003 | Platzgummer et al. |
| 2004/0141169 | A1* | 7/2004 | Wieland et al. .............. 355/133 |
| 2004/0251431 | A1* | 12/2004 | Yamaguchi et al. ...... 250/492.3 |

FOREIGN PATENT DOCUMENTS

| EP | 0 312 653 | 4/1989 |
| WO | WO 03/017317 | 2/2003 |

OTHER PUBLICATIONS

PCT International Search Report, dated Aug. 4, 2006.
R. L. Mills, J. Sankar, P. Ray, A. Voigt, J. He, B. Dhandapani, Synthesis of HDLC films from solid carbon, Journal of Materials Science, 2004, vol. 39, pp. 3309-3318.

* cited by examiner

*Primary Examiner*—Jack I Berman
*Assistant Examiner*—Hanway Chang
(74) *Attorney, Agent, or Firm*—RatnerPrestia

(57) ABSTRACT

A particle-beam projection processing apparatus for irradiating a target, with an illumination system for forming a wide-area illuminating beam of energetic electrically charged particles; a pattern definition means for positioning an aperture pattern in the path of the illuminating beam; and a projection system for projecting the beam thus patterned onto a target to be positioned after the projection system. A foil located across the path of the patterned beam is positioned between the pattern definition means and the position of the target at a location close to an image of the aperture pattern formed by the projection system.

15 Claims, 4 Drawing Sheets

CHARGED-PARTICLE EXPOSURE APPARATUS

CROSS-REFERENCE TO RELATED APPLICATIONS

This application is a U.S. National Stage application of PCT Application No. PCT AT06/000060, filed Feb. 16, 2006, which claims priority from Austrian Patent Application No. A 273/2005, filed on Feb. 18, 2005.

FIELD OF THE INVENTION AND DESCRIPTION OF PRIOR ART

The invention relates to improvements on particle-beam projection processing apparatus for irradiating a target by means of a beam of energetic electrically charged particles, comprising an illumination system, a pattern definition (PD) means and a projection system in order to project the beam patterned by the PD means onto a target positioned after the projection system. The illumination system serves to generate and form the energetic particles into a wide-area illuminating beam which is substantially tele/homocentric at the location of the PD means and whose diameter is greater by at least one order of magnitude than the length of the tele/homocentricity region of the illuminating beam; the PD means, located after the illumination system as seen along the direction of the beam, positions an aperture pattern composed of apertures transparent to the energetic particles in the path of the illuminating beam, thus forming a patterned beam emerging from the aperture pattern; and the projection system, positioned after the pattern definition means, projects the patterned beam as mentioned.

One important application of processing apparatus of this kind is in the field of particle-beam lithography used in semi-conductor technology, as a lithography apparatus, wherein, in order to define a desired pattern on a substrate surface, the wafer is covered with a layer of a radiation-sensitive photoresist, a desired structure is imaged onto the photoresist by means of a lithography apparatus which is then patterned by partial removal according to the pattern defined by the previous exposure step and then used as a mask for further structuring processes such as etching. Another important application of processing apparatus of this kind is in the field of nano-scale patterning, by direct ion beam material modification or ion beam induced etching and/or deposition, used for the fabrication or functionalization of nano-scale devices, particularly having sub-100 nm feature sizes.

The IMS-concept PLM2 (short for "Projection Mask-Less Lithography") as described in the U.S. Pat. No. 6,768,125 realizes a multi-beam direct write concept uses a programmable aperture plate system (APS) as PD device for structuring an electron beam, which is extracted from a single electron source. At the APS the kinetic energy of the electrons is 5 keV. After the APS the electrons are accelerated to 100 keV and the image of the APS is reduced 200 times and projected onto the substrate.

In an electron optical system, scattered electrons from the lenses and the APS produce low energetic electrons or ions. Also residual gas atoms ionized either due to the beam or due to large electrostatic fields can be produced. These particles may irradiate the wafer and form a background dose which reduces the contrast of the image. Also components of the electron-optical systems (e.g. lenses and APS) are likely to be contaminated by these particles or, what is unavoidable in lithographical use, by organical resist outgassing from the wafer. The particles may be accelerated into the column, whereas mainly the PD system is sensitive to contamination and, as a consequence, might be affected by local charging effects. The APS can be practically used under high or ultra high vacuum conditions only, otherwise the apertures would accrete due to beam induced deposition of organical material. However, the required high vacuum stage is a major technical issue and cost factor of an overall lithography system like the PML2. It would be an enormous advantage for the PML2 concept to keep the APS under high or ultra high vacuum conditions and apply a conventional air bearing stage (e.g. from manufacturer AeroLas) in a pressure range above 1 mbar at the substrate. Additionally, an important concern for the use of an PML2 apparatus in the semiconductor fabrication environment is connected with the danger of system failure, which could be due to a break down of parts of the aperture plates or electron source. Such an event could lead to severe contamination of the wafer, wafer stage and wafer handling systems. The acceptability of an apparatus for a semiconductor fabrication line is strongly dependent on the reliability of the system with respect to particle purity and the risk of failure during operation.

Another aspect of electron-optical systems is the compensation of imaging aberrations for large image fields. As is well-known in prior art, electrostatic lenses formed by a combination of annular electrodes always are focusing lenses (positive refracting power) and, without exception, have significant aberrations of the third order which can only be slightly influenced by the shape of the electrode geometry. By using diverging lenses (negative refractive power) it is possible to achieve a compensation of the aberrations of the combined lens system by cancellation of the contributions to the third-order aberrations of the focusing and diverging lenses, and further making also possible to greatly reduce the other coefficients of aberrations. It is not possible, though, to achieve a lens of negative refractive power by means of annular electrodes alone; on the contrary, it is necessary to use a plate or control grid electrode through which the beam passes.

U.S. Pat. No. 6,326,632 of the applicant/assignee proposes to use the mask of a lithography apparatus to form diverging lenses in combination with annular electrodes located in front and after the mask, respectively. However, it is often desirable to have a diverging lens located after the mask or PD device, without involving the latter (particularly if its electrostatic potential cannot be controlled to a satisfactory degree). For such a diverging lens located after the mask or PD device, the plate electrode will cause unwanted effects, most notably absorption and scattering of the beam radiation. For modern structuring purposes, where the minimum feature size is more and more pushed towards lower values, scattering is the most disturbing effect since it leads to blurring of the pattern features.

SUMMARY OF THE INVENTION

It is a goal of the present invention to provide a particle-beam system using an additional foil, in the following referred to as "transmission foil", in the region of the beam after the PD system in which overcomes the above-mentioned problems. The provision of a foil is meant to separate spaces containing different gases and/or gas pressures. This enables the use of a mechanical scanning system, which can be run at a residual pressure significantly higher than those that are usually acceptable within an electro-optical device, so existing air bearing stages operated typically at 1-10 mbar can be used. It further allows of a significant improvement of particle purity at the optical columns and APS, and offers a means to avoid a severe contamination and related risks when used in a semiconductor fabrication line.

This aim is met by a particle-beam projection processing apparatus of the kind as described above, which further comprises at least one transmission foil located across the path of the patterned beam, said foil(s) being positioned between the pattern definition means and the position of the target at a location close to a respective image of the aperture pattern formed by the projection system. The transmission foil may be made of an electrically conductive material and is held at a well defined electrical potential, so the charged particle beam is neither affected by local charging at the surface or inside the foil, nor by a floating electrical field due to a floating foil potential. It shall be mentioned that the transmission foil may be made as well of an insulating or semiconducting material provided above-mentioned effects (charging, floating potential) are compensated directly or indirectly by either the transmitting beam itself (e.g. by creating electron-hole pairs, etc.), or other supplementary measures which improve charge transport or charge balance along the foil, such as in-situ irradiation with UV light or atomic beams.

In this context, the foil is considered to be close to the image when the distance between the foil and the image is not greater than the focal length of the consecutive lens immediately before or after the foil, preferably not greater than ⅕ of that focal length.

The basic idea of the invention is to use a thin electrical conducting membrane as transmission foil for filtering particle flows in both directions and/or as electrode close to the position of an image to improve the optical imaging properties. If the image is the final image, its position coincides with the surface of the substrate used as target, so the corresponding foil is positioned close to the target. Due to this choice of the location, deviations in the direction of transmitted beam particles have no or only marginal effect on the imaging properties of the system. Furthermore, the foil can be used as an interlock sensor representing a safeguard device that can rapidly trigger a safety valve in case of mechanical or electrical breakdown that causes a destruction of the foil.

The implementation of such a foil is possible since in the type of apparatus considered here, the beam has a wide cross-section. In other systems such as a TEM or a Gaussian beam writer, the imaging optics provide for a beam focused to a narrow, almost point-like, image location. The latter would destroy or contaminate a foil within a comparably short time, not only because of the exposition to radiation, but also due to heating imparting by absorption. In contrast, with the invention the beam is distributed over a comparatively wide area which allows sufficient cooling of the foil, which is done by thermal radiation and conductive cooling over the edge of the foil. Calculations made be the applicants showed that a foil of 0.2 µm will heat up by about 170 K only during continuous exposure to an electron beam in a PML2 apparatus even if only conductive cooling is taken into account. The current density on the foil in the present invention is about $10^{-07}$ A/cm² (assuming here 10 µA current through a 1 mm² area), which is about 10 million times lower than that in a typical focused beam system.

In one realization of the invention such a transmission foil is located in front of the position of the target as seen along the direction of the beam. The distance between the target and the foil is small, so even for those particles which are scattered during their passage through the foil, this will have marginal effect upon the location the particles hit upon the target. The foil may be held at an electrical potential, thus forming a final electrode of the projection system, which is suitable to realize a divergent lens in combination with some other pre-final (annular) electrodes.

An image may also be present at other places, in particular an intermediate image which may come about when the projection system comprises at least two consecutive projector stages, namely, at least one non-final projector stage and one final projector stage. In this case a transmission foil according to the invention may be at (or close to) the location of an intermediate image formed from the aperture pattern by a non-final stage of the projection system. Due to the nature of imaging, the radiation is allowed to emerge from the points of an image at any direction (albeit within a certain opening angle), which is why scattering of the beam particles in the foil has only little, if not marginal, effect on the imaging properties of the optical system.

In order to deal with beam components which are scattered off by angles that are too high to be processed in the electron-optical system, an aperture diaphragm may be located after the transmission foil as seen along the direction of the beam, said diaphragm having an aperture limiting the lateral extension of the beam. This measure also rules out problems that may occur with regard to higher-order imaging coefficients.

Preferably, the transmission foil is sufficiently thin to allow propagation of a fraction of the irradiating beam through the foil at low angles. A typical thickness will be in the order of 100-200 nm.

Beside the possibility to use the foil as a plate electrode, the foil is a barrier for gas particles, thus separating the electrooptical column into different sections which may have different vacuum properties (gas filling, pressure) and preventing contamination between sections thus formed. Only fast particles, namely the particles (e.g. electrons) of the particle beam, are able to overcome this mechanical barrier. Thus, the transmission foil may separate two adjacent recipients held at different gas pressures. The transmission foil may, preferably, be continuous across the area of the respective image of the aperture pattern, in order to ensure uniform transparency behavior for each part of the image. The thickness is then chosen suitably (minimum thickness) to allow passage through the foil only for particles having a minimum kinetic energy.

Another aspect of the invention concerns the material of the transmission foil. Apart from electrically conducting materials such as metal foils, such as a copper foil with a suitable inert covering if necessary, the foil may be made from a semiconductor material, such as silicon or diamond-like carbon.

The foil may also be used as an additional safeguarding device, in conjunction with a sensor means adapted to monitor the integrity of the transmission foil and a mechanical shutter means located near an opening for the patterned beam within the apparatus, such that the shutter means closes the opening upon detection of a damage to said foil by the sensor means.

BRIEF DESCRIPTION OF THE DRAWINGS

In the following, the present invention is described in more detail with reference to the drawings.

DETAILED DESCRIPTION OF THE INVENTION

The preferred embodiment of the invention discussed in the following is based on the PML2-type particle-beam exposure apparatus with a pattern definition (PD) system as disclosed in the U.S. Pat. No. 6,768,125 (=GB 2 389 454 A) of the applicant (assignee). In the following, first the technical background of the apparatus is discussed as far as relevant to the invention, then embodiments of the invention are discussed in detail. It should be appreciated that the invention is not restricted to the following embodiments nor the PD system, which merely represent one of the possible implementations of the invention; rather, the invention is suitable for other types of processing systems that employ a particle-beam as well.

PML2 System

Figure 1:
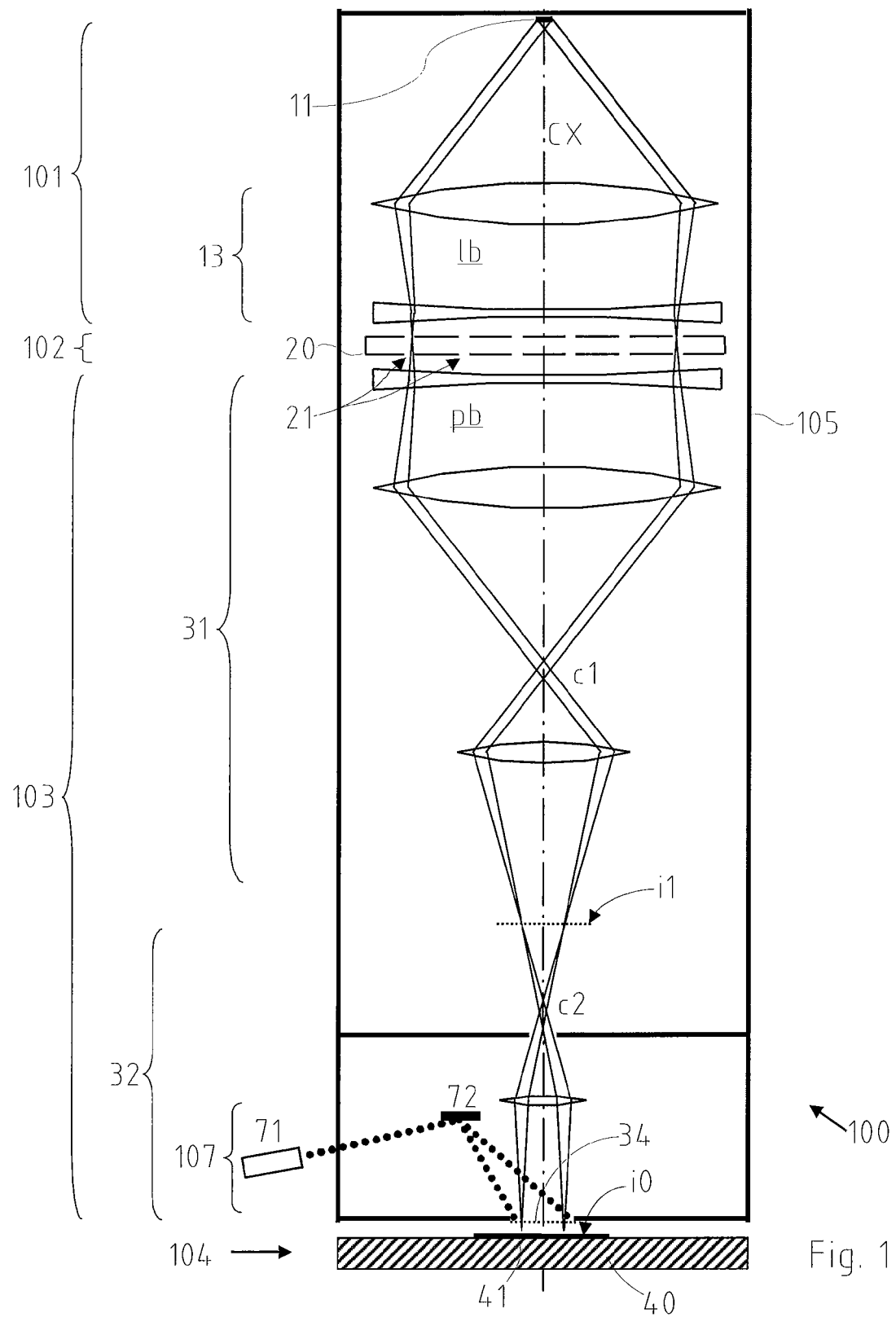
FIG. 1 shows a first embodiment of the invention having a transmission foil immediately in front of the target.

An overview of a maskless particle-beam exposure apparatus PML2 employing a first preferred embodiment of the invention is shown in FIG. 1. In the following, only those details are given as needed to disclose the invention; for the sake of clarity, the components are not shown to size in FIG. 1, particularly the lateral width of the particle beam is exaggerated.

As already mentioned, an electron beam generated by an illumination system is used in the PML2 system. It illuminates a PD means having a regular array of apertures in order to define a beam pattern to be projected on a target surface. With each aperture, a small beam is defined, and the passage of each beam through an aperture can be controlled so as to allow ('switch on') or effectively deactivate ('switch off') the passage of particles of the beam through the respective apertures. The beam permeating the aperture array (or more exactly, through the switched-on apertures of the array) forms a patterned particle beam bearing a pattern information as represented by the spatial arrangement of the apertures. The patterned beam is then projected by means of a particle-optical projection system onto the target (for instance, a semiconductor substrate) where an image of the apertures is thus formed to modify the target at the irradiated portions. The image formed by the beam is moved continuously along a straight path over each die field; additional scanning of the beam in a direction perpendicular to the scanning direction is not necessary (except, where needed, to compensate for lateral travel motion errors of the scanning stage).

The main components of the apparatus 100 are—corresponding to the direction of the lithography beam lb, pb which in this example runs vertically downward in FIG. 1—an illumination system 101, a PD system 102, a projecting system 103, and a target station 104 with the substrate 41. The particle-optical systems 101, 103 are realized using electrostatic or electromagnetic lenses. The electro-optical parts 101,102,103 of the apparatus 100 are contained in a vacuum housing 105 held at high vacuum to ensure an unimpeded propagation of the beam lb, pb along the optical axis cx of the apparatus.

The illumination system 101 comprises, for instance, an electron source 11 and a condenser lens system 13. It should, however, be noted that in place of electrons, in general, other electrically charged particles can be used as well. Apart from electrons (emitted from an electron gun) these can be, for instance, hydrogen ions or heavy ions; in the context of this disclosure heavy ions refer to ions of elements heavier than C, such as O, N, or the noble gases Ne, Ar, Kr, Xe.

The electron source 11 (in principle also ions are possible) emits energetic electrons, i.e., having a defined (kinetic) energy of typically several keV (e.g. 5 keV at the PD system 102) with a comparatively small energy spread of, e.g., $\Delta E=6$ eV. By means of an electro-optical condenser lens system 13, the ions emitted from the source 11 are formed into a wide-area, substantially telecentric electron beam serving as lithography beam lb.

The lithography beam lb then irradiates a PD device 20 which, together with the devices needed to keep its position, form the PD system 102. The PD device 20 is held at a specific position in the path of the lithography beam lb, which thus irradiates an aperture pattern 21 formed by a plurality of apertures. As already mentioned, some of the apertures are "switched on" or "open" so as to be transparent to the incident beam; the other apertures are "switched off" or "closed", i.e. non-transparent (opaque) to the beam. The pattern of switched-on apertures is chosen according to the pattern to be exposed on the substrate, as these apertures are the only portions of the PD device transparent to the beam lb, which is thus formed into a patterned beam pb emerging from the apertures (i.e., in FIG. 1, below the device 20). For details about the architecture and operation of the PD device, and in particular the architecture of its blanking plate, the reader is referred to the U.S. Pat. No. 6,768,125.

The pattern as represented by the patterned beam pb is then projected by means of an electro-optical projection system 103 onto the substrate 41 where it forms an image of the switched-on mask apertures 21. The projection system 103 implements a demagnification of, for instance, 200×. The substrate 41 is, for instance, a silicon wafer covered with a photo-resist layer. The wafer 41 is held and positioned by a wafer stage 40 of the target station 104.

In the embodiment of the invention shown in FIG. 1, the projection system 103 is composed of two consecutive electro-optical projector stages 31, 32 with a crossover c1, c2, respectively. The electrostatic lenses used to realize the projectors 31,32 are shown in FIG. 1 in symbolic form only as technical realizations of electrostatic imaging systems are well known in the prior art, such as, for instance, the U.S. Pat. No. 4,985,634 (=EP 0 344 646) of the applicant. The first projector stage 31 images the plane of the apertures of the device 20 to an intermediate image i1 which in turn is imaged onto the substrate surface by means of the second projector stage 32. Both stages 31,32 employ a demagnifying imaging through crossovers c1,c2; thus, while the intermediate image i1 is inverted, the final image i0 produced on the substrate is upright (non-inverted). The demagnification factor is about 14× for both stages, resulting in an overall demagnification of 200×. A demagnification of this order is in particular suitable with a lithography setup, in order to elevate problems of miniaturization in the PD device.

After the first stage 31 the beam width is well reduced—for instance, from an initial width of a PD field of L=60 mm to about 4 mm at the intermediate image. As a consequence, since the dimensions of the electro-optical components of the second stage 32 need not be reduced to the same scale as the beam width, the lens elements can be realized larger with respect to the beam, which allows for an easier treatment of lens defects and imaging aberrations. For example, with a total source-substrate length of about 2 m, the focal length of the final lens after the second stage crossover c2 can be as small as about 20 mm. This allows for high currents that can be treated, for instance of the order of 4 to 10 μA, because space charge correlation have only little influence.

In both projector stages the respective lens system is well compensated with respect to chromatic and geometric aberrations; furthermore, a residual chromatic aberration of the first stage 31 can be compensated by suitable fine correction of the electrode potentials in the second stage 32. By virtue of the chromatic compensation, the energy of the ions (or in general, charged particles) emitted from the source 11 are allowed to have a comparatively high energy spread of up to $\Delta E=6$ eV. This allows to use sources with less stringent requirements for quality and, therefore, emitting higher currents.

Furthermore, the effect of stochastic errors, which are due to particle interactions mainly in the crossovers c1,c2, is reduced as the stochastic errors of the first stage are demagnified in the second stage, and stochastic errors in the second stage have little influence due to the small distance of the second crossover c2 from the substrate plane.

As a means to shift the image laterally, i.e. along a direction perpendicular to the optical axis cx, deflection means (not shown) are provided in one or both of the projector stages. The deflection means can be realized as, for instance, a multipole electrode system; as discussed in the U.S. Pat. No. 6,768,125; additionally, a magnetic coil may be used to generate a rotation of the pattern in the substrate plane where needed. The electrooptical lenses are mainly composed of electrostatic electrodes, but magnetic lenses may also be used.

According to the invention a thin foil is positioned as transmission foil in the path of the patterned beam pb close to the location where an image is formed. In the present PML2 system, two images are formed, namely, the intermediate image i1 and the final image i0 (the latter being formed on the target surface). Consequently, there are two possible regions in this case to place a foil according to the invention.

EXAMPLE 1

Foil Near to the Final Image

In the first embodiment which is shown in FIG. 1, a thin transmission foil 34 is placed between the last lens and the substrate, so as to bring the foil near to the position of the final image. Preferably, the distance between the foil 34 and the target 41 is very small, in the range of 200-500 µm. While elastic and/or inelastic scattering of some part of the electrons in the foil is inevitable, which will rise to an additional contribution to the blur of imaging (scattering blur), by virtue of the small distance between the foil and the substrate the scattering blur contribution is very small. Details of scattering are further discussed below. The inelastically scattered electrons have a reduced kinetic energy, but at the end of the column the field of the lenses is zero and therefore the trajectory of the electrons is not changed (there is not extra chromatic blur).

For a gap between the foil and substrate of $\Delta l=200$ µm, the allowed extra blur is about 10 nm resulting in an inelastic scattering angle of $\theta_i=50$ µrad. In order to reduce the extra blur due to elastically scattered electrons the gap has to much smaller, e.g. $\Delta l=0.5$ µm, resulting in an allowed extra blur of 10 nm and an elastic scattering angle of $\theta_e=19.6$ mrad. Therefore it is very important to reduce the intensity of elastically scattered electrons as discussed below.

The foil 34 effectively closes the housing 105 against the target 41, and prevents out-gassing products from the resist, or other source of contaminants on the target, to enter the electro-optical system 101-103 of the apparatus. As a consequence, the entire optical column is protected against contamination. On the other hand, due to the small distance between the foil 34 and the substrate 41, it may be likely that the foil will be contaminated by out-gassing products adsorbed to the foil surface. A heating system 107 is provided for cleaning the foil by heating so the contaminants evaporate (desorb) towards the side of the target and can be pumped off there (the pumping system is not shown). The heating system is, however, positioned at the side of the foil opposite the target; it comprises a laser 71 for producing an IR laser beam, for instance, and a movable mirror 72 mounted inside the housing. By means of the mirror 72 the laser beam is scanned over the area of the foil 34. The laser beam heats up the lighted region of the foil which is thus cleaned successively.

The foil can be used as a diverging electrostatic lens in cooperation with the last electrostatic electrodes. The use of a diverging electrostatic lens enhances the optical properties of the imaging system 103. For instance, the imaging aberration blur can be reduced about 15%.

The foil 34 is made from a silicon disk etched to a thickness of about 100 µm. Processes for producing silicon foils or foils from diamond-like carbon are well-known in prior art.

One suitable method to synthesize conductive diamond-like carbon (DLC) films uses plasma chemical vapor deposition (MPCVD). The films are synthesized on silicon substrates from solid carbon by a very low power (60 W) MPCVD reaction of a mixture of 90-70% helium and 10-30% hydrogen, as described e.g. in "Synthesis of HDLC films from solid carbon", R. L. Mills, J. Sankar, P. Ray, A. Voigt, J. He and B. Dhandapani, Journal of Materials Science (2004), 39, 3309.

EXAMPLE 2

Foil at the Intermediate Image

Figure 2:
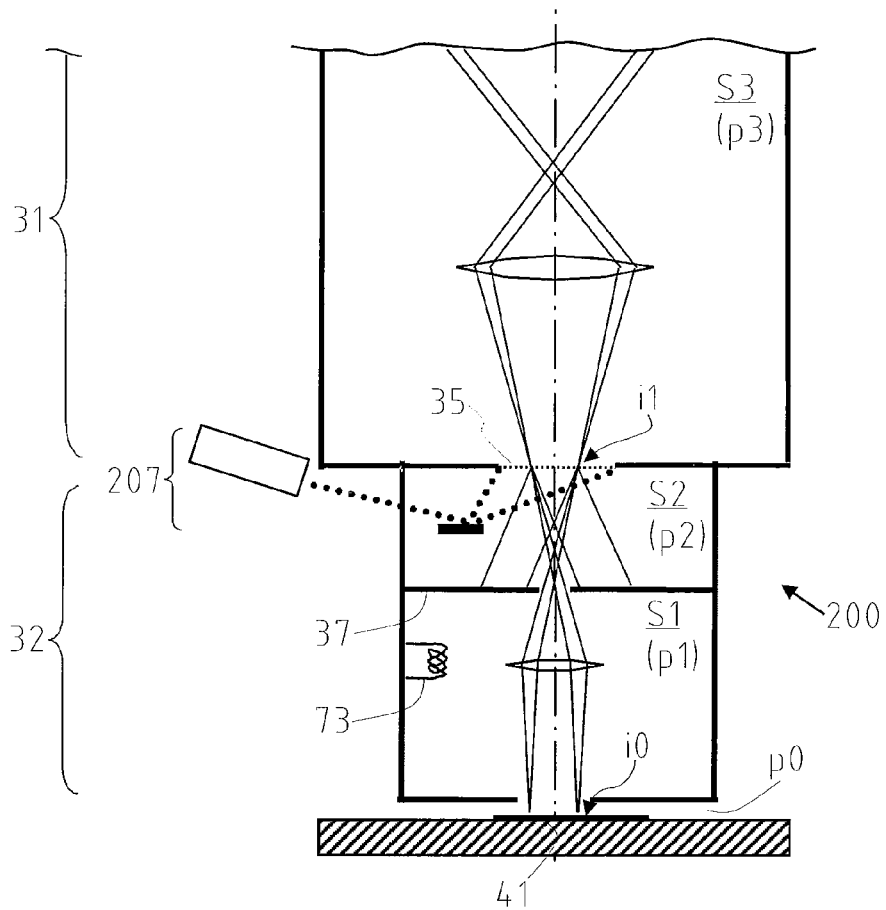
FIG. 2 shows a second embodiment of the invention where the transmission foil is located at the intermediate image.

FIG. 2 illustrates a second embodiment 200 of the invention, in which a part of the apparatus 200 is shown; elements of the apparatus 200 not described below are identical to those of the apparatus 100 of FIG. 1; same reference numbers refer to corresponding elements throughout.

As a consequence of the fact that the foil 35 is located at the position of the intermediate image i1, electrons which are scattered off their initial beam path are, nonetheless, focused at the final image plane i0 to the zero loss peak. Electrons which are scattered with a higher angle than 1.1 mrad have an increased spherical aberration, and these electrons are suitably blanked by a blanking diaphragm 37 situated after the foil 35.

The foil 35 divides the apparatus 200 into consecutive sections. In the first section S3, comprising the source 11, illuminating system 101, the PD device 102 and the part of the projection system until the intermediate image i1, is a separated low-pressure chamber in which the pressure p3 is in the range of $10^{-9}$ mbar, for instance. The high-pressure side of the foil is sectored into two further sections S2, S1 (at pressures p2, p1, respectively) by the diaphragm 37. The diaphragm aperture through which the beam bp can propagate also serves as pumping opening. The sections are pumped differentially with respect to the pressure p0 at the place around the target 41. For instance, p1~p0/1000, p2~p1/1000. (The symbol denotes 'approximately equal'. The pumping arrangements are not shown in the figures.) By virtue of this setup, the pressure at the foil downstream side (facing toward the target) is considerably lower than at the substrate (pressure p0), in this example by a factor of about $10^6$. This layout complies with another requirement, that the gas pressure p1 in the section S1 should by sufficiently low, namely, in the order of $10^{-2}$ mbar or lower, in order to ensure a mean free path of the electrons that is sufficiently high so as to allow unimpeded passage through the entire optical system. In contrast, the pressure p0 at the substrate will be in the order of a few ten mbar, for instance 56 mbar.

One important aspect of this embodiment is reduction of contamination of the foil, because the contamination is propositional to the current density and to the pressure. The diameter of the intermediate image is in the range of 1.6 mm. The intermediate image is 10 time larger and the current density is 100 times lower than on the image at the substrate. The pressure p2 of the high pressure side of the foil is ~1000000 times smaller than the pressure of the substrate p0.

The electrooptical column between the foil 35 and the substrate can be heated by means of a heater 73 located in sections S1 and/or S2. Furthermore, a heating system 207 for heating the foil is provided, comprising a laser beam, reflected on a moveable mirror as discussed above. In the embodiment shown, the heating system 207 is located after the foil 35 in the section S2; in a variant it may also be situated in front of the foil 35 (like heating system 107 of the first embodiment).

Furthermore, the foil can be used as a diverging electrostatic lens and the optical properties can be enhanced.

Scattering at a Membrane

Figure 3:
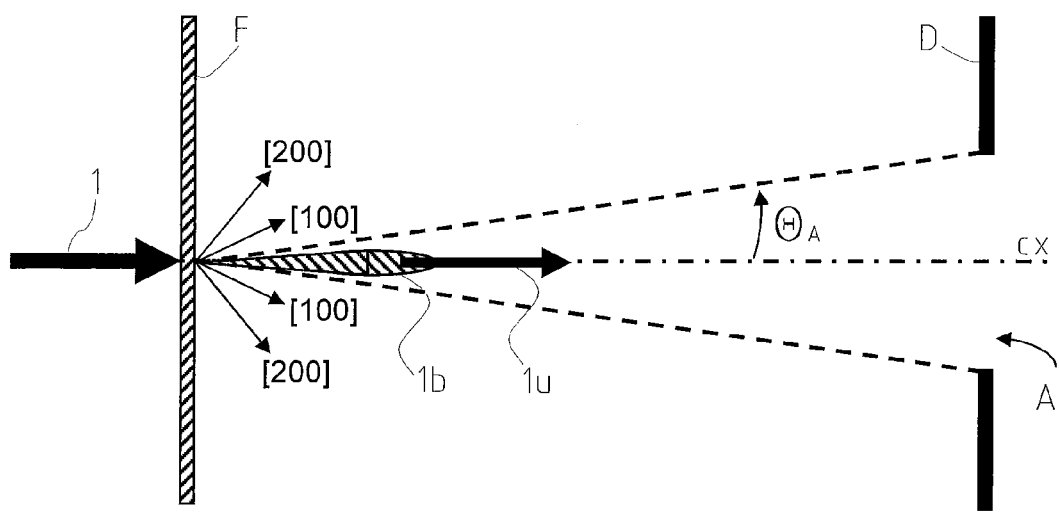
FIG. 3 illustrates scattering of the particle beam at the foil.

FIG. 3 shows a detail of the particle beam at a membrane F (corresponding to foils 34, 35 of FIGS. 1 and 2, respectively) and illustrates the scattering of the beam particles. (It should be noted that in FIG. 3 the optical axis cx is turned so as to be horizontal.) Scattering is due to different physical interactions between fast electrons (or particles) during their passage through a solid. As shown in FIG. 3, the electrons irradiated in the form of a primary beam 1 upon a membrane F can be elastically scattered (the flight direction is changed, but the kinetic energy is unchanged) or inelastically scattered (the electrons lose a bit of their kinetic energy and the foil is heated). Both effects cause a changed flight direction of primary electrons.

Elastic scattering occurs if the foil has a crystal structure, and a Bragg reflex will be formed at the substrate. Bragg reflexes are denoted in FIG. 3 by Miller symbols [100] and [200]. The elastic scattering angle $\theta_e$ obeys the relation $\theta_e = \lambda/(2d)$, wherein d is the distance between lattice planes of the foil as defined by the Miller indices, and $\lambda$ is the wavelength of the electron. All angles are given in radians where not explicitly denoted otherwise. For instance, for the Bragg-reflection of 100 keV electrons ($\lambda_{100keV}=3.7\times10^{-12}$ m) passing through silicon (lattice constant $5.43\times10^{-10}$ m) the smallest elastic scattering angel is $\theta_{e,min}=3.4$ mrad.

Thus, the gap between a Bragg reflex and the direct beam is a linear function of the distance between the foil and the substrate. The scattering angle is in the range of several mrad.

Inelastic scattering can take place due to phonon stimulation (energy loss $\Delta E<1$ eV), plasmon stimulation ($\Delta E=5$-$30$ eV) and ionization of core levels ($\Delta E \sim$ keV). The inelastic scattering angle relates to the energy loss by $\theta_i = \Delta E/(2 E_{kin})$. Plasmons are the most important cause of inelastic scattering. For plasmon-related inelastic scattering the energy loss of electrons with a kinetic energy of 100 keV results the scattering angle is in the range of appr. 50 μrad.

In general the larger part of the electrons is elastically scattered. Only a few percent of the primary electrons are inelastically scattered. This is a consequence of the fact that for large electron energies, i.e. >1 keV, the inelastic mean free path exceeds the elastic mean free path by an order of magnitude.

It is well known that only a part of the electrons (less than a quarter, depending on material and thickness) irradiated to a silicon foil traverse the foil without elastic or inelastic scattering, so as to form the so-called zero-loss peak at the substrate. The other electrons (more than three quarters, depending on material and thickness) are scattered elastically or inelastically. These electrons are able to irradiate the substrate outside the zero loss peak. While the inelastically scattered electrons will produce a blurred spot, the elastically scattered electrons will form Bragg reflexes on the substrate. Since the latter process is dominant and the Bragg angles are large, it is very important to reduce the number of elastically scattered electrons to improve the efficiency of the electron beam when a foil is present in the beam path.

The parts of the beam with large scattering angles are blanked by means of a blanking diaphragm D (corresponding to diaphragm 37 of FIG. 2), in order to ensure a reduced spherical aberration, and the electrons with a small scattering angel are focused to one spot at the image plane. The numerical aperture is increased and therefore the space charged at the last cross over reduced. The main part of the beam which undergoes scattering by a small angle only (inelastic scattering, symbolized by a lobe 1b) or remains unscattered (arrow 1u) propagates unimpeded through the aperture A of the diaphragm D.

In the apparatus 200 of FIG. 2, the distance between the foil 35 and the diaphragm 37 is appr. 90 mm. The diameter of the diaphragm aperture A is 200 μm, resulting in an opening angle $\theta_A$ (FIG. 3) of 1.1 mrad. (Of course, all values given here are of exemplary nature only and will vary according to the specific implementation.) All electrons that are scattered to an angle higher than the opening angle $\theta_A$ are blanked and all electrons with a smaller scatter angel are focused again at the image plate to one point. The numerical aperture is increased to 100 μrad. As a result, the last cross over is broadened and, in turn, the coulomb interaction, the stochastic blur and space-charge blur are reduced.

Beside blanking out beam parts that are scattered to high angles, an other possible way to reduce and homogenize the electron background on the substrate may be suitable varying the thickness of the foil/membrane, in order to minimize the intensity of a Bragg reflex, in particular the first Bragg reflex [100]. Consequently, the dominant Bragg spots can be reduced by suitable choice of the foil thickness. Yet another measure could be to provide an atomic structure of the foil which is not a single crystal. If the crystal orientation has a random orientation then the electrons on the substrate are not focused to Bragg reflex. The electrons density beyond the zero loss peak are rings and the intensity is distributed along the circumference.

One plasmon causes an energy loss of appr. 15 eV and therefore a chromatic blur of 10 nm. For large kinetic energies (100 keV) the inelastic mean free path $\lambda_i$ in silicon is about 110 nm. In a thin silicon foil (e.g., 200 nm thick) only few electrons will excite more than one plasmon (since the mean free path for inelastic scattering of electrons with large kinetic energies is about 110 nm), so almost all electrons scattered inelastically will have an energy loss in the range of 5-15 eV. On the other hand, elastic scattering is the dominant process and only few percent of the primary electrons will be inelastically scattered.

At the intermediate image the numerical aperture is in the range of 49 μrad (without the foil) and the spherical blur in the range of 5 nm. The inelastically scattered electrons have a numerical aperture increased to 98 μrad, and therefore the spherical blur is raised to 10 nm. But only 5% of the electrons are inelastically scattered and these electrons are forming an extra background dose at the wafer.

Contamination of the Foil

Contamination of the foil occurs basically from two sources: outgassing products from the target and irradiation-induced contamination from the residual gas in the apparatus. The former contribution was already discussed above; in the following, we address the latter. Irradiation-induced contamination is proportional to the current density of the irradiation and pressure. For instance, a TEM uses a single focused electron beam to irradiate the probe in a single 10 nm spot and the current density is in the range of 30 A/cm². In the PML2 apparatus several hundreds thousand multi beams are used, adding up to a total current through the column of about 8 µA. The image size at the substrate is about 160 µm and the current density is 31 mA/cm². The current density is 1000 times smaller than for a single focused beam. If the foil is placed at the end of the column (Example 1), the pressure is at the foil equal to the pressure at the substrate. Therefore, the lifetime of the foil in the PML2 apparatus is much longer than in a normal single focused beam setup (e.g. TEM).

If the foil is positioned at the intermediate image (Example 2) contamination is further reduced as a consequence of the fact that the pressure is substantially smaller.

EXAMPLE 3

Two Foils

Figure 4:
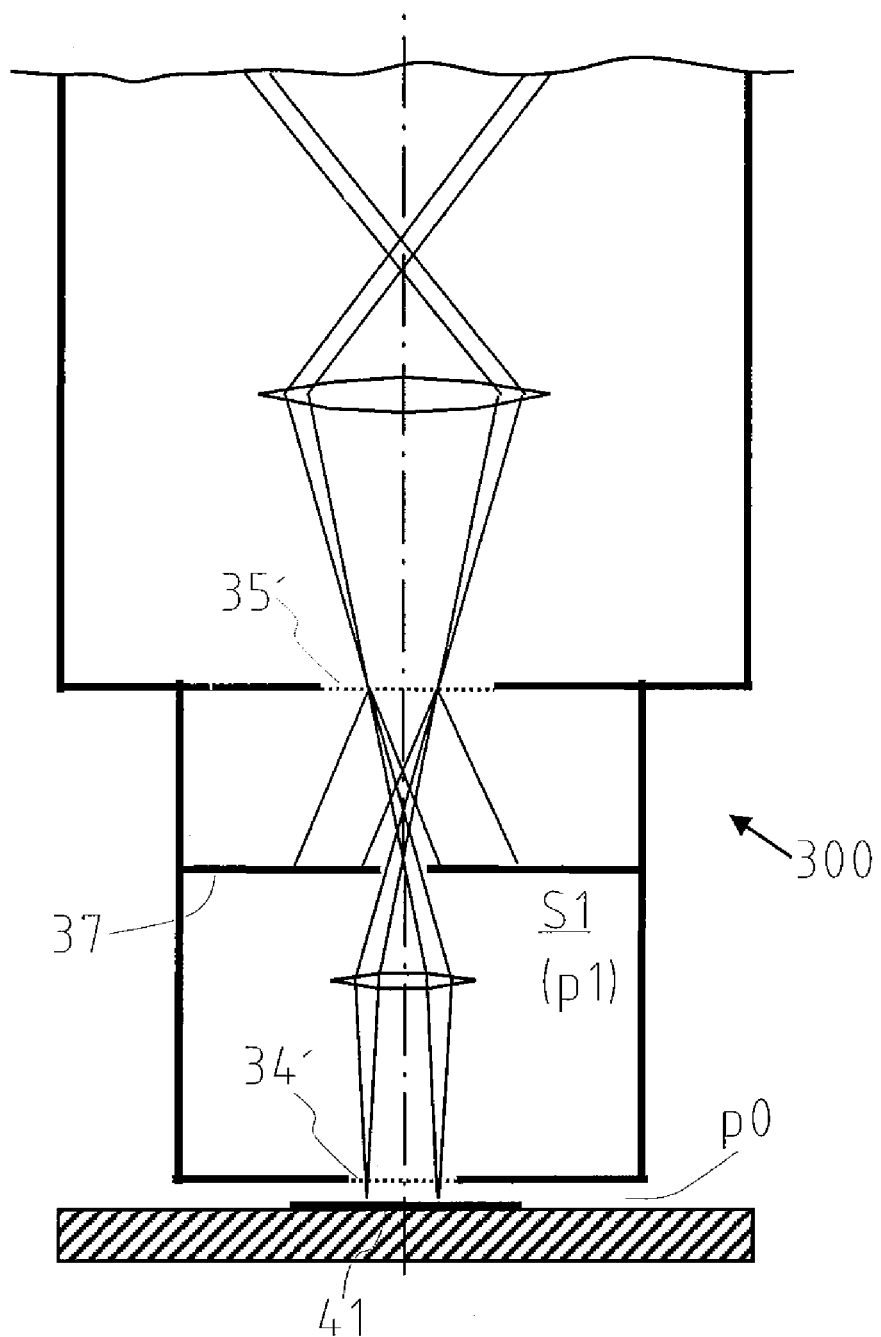
FIG. 4 shows a further embodiment with two transmission foils.

FIG. 4 shows another embodiment of the invention, namely an apparatus 300 which comprises two foils 34',35' both at the intermediate image and in front of the target. Thus, the beneficial features of the foils can be combined. In particular, the foil 35' at the intermediate image reduces the coulomb interaction at the last cross over and the total current through the coulomb can be increased (the coulomb interaction blur is the dominate blur), while the final foil 34' prevents contamination of the optical components of the second stage 32 due to resist out gassing since the section S1 is not vacuum separated from the pressure p0 above the target 41.

Interlock Sensor and Safety Valve

Figure 5A:
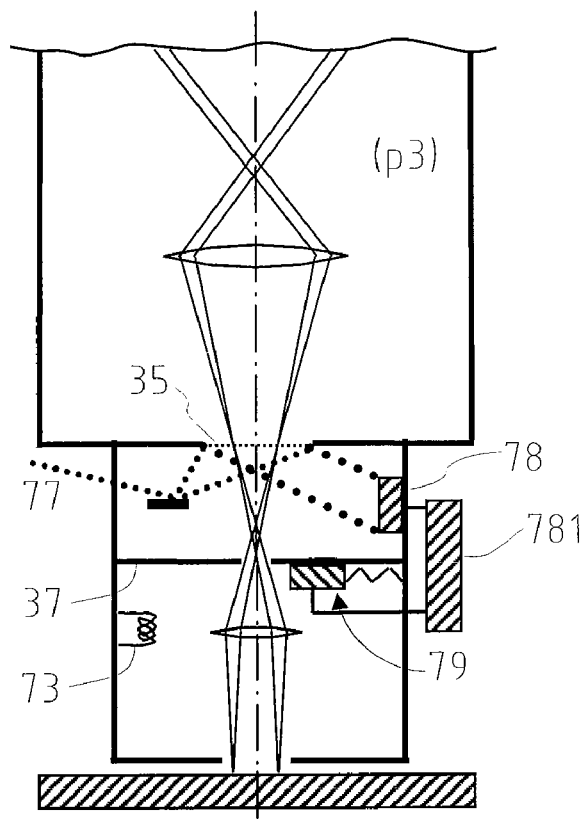
FIG. 5 illustrates the principle of using the foil as an interlock sensor in conjunction with a safety valve.
Figure 5B:
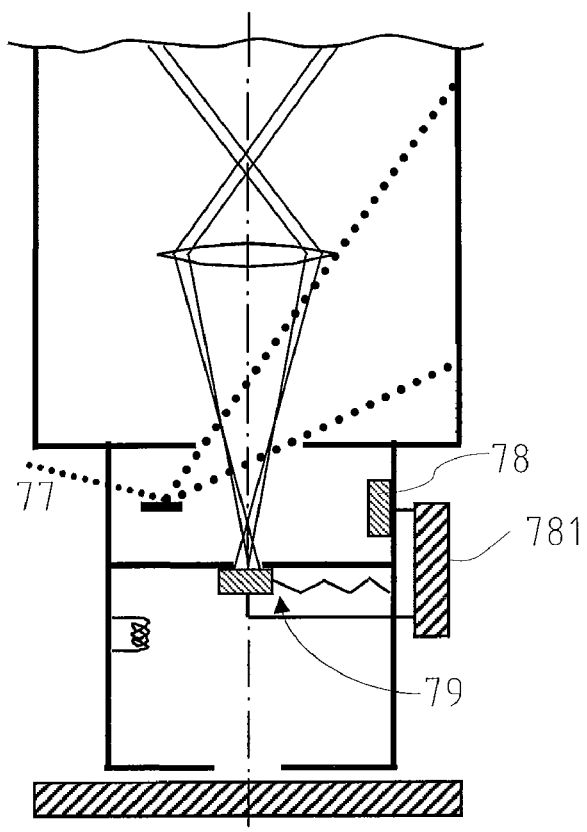

As shown in FIGS. 5a and 5b, the foil may also be used as an interlock sensor to realize a safeguard device in conjunction with a safety valve. The safeguard device is used to rapidly trigger a safety valve in case of mechanical or electrical breakdown that causes a destruction of the foil. Referring to FIG. 5a, radiation 77, such as laser beam like the one used also as heating laser, is directed onto the foil 35 and the reflected light is detected by a sensor 78. The sensor is connected to a safeguard circuit 781 which controls a mechanical safety valve 79 which is placed near a suitable opening such as the blanking diaphragm 37. If the foil is damaged or otherwise impaired (for instance, due to the heat load or particles from a damaged APS) as shown in FIG. 5b, the laser beam 77 is no longer reflected to the sensor and by means of the safeguard circuit the safety valve 79 closes, preferably within 1 ms. The mechanical shutter is a safety equipment to preclude contamination of the wafer with particles that come from the optical column or vice versa. The shutter also protects the ultra high pressure p3 of the APS system and electron source if the foil is destroyed.

Although the invention is illustrated and described herein with reference to specific embodiments, the invention is not intended to be limited to the details shown. Rather, various modifications may be made in the details within the scope and range of equivalents of the claims and without departing from the invention.

We claim:

1. A particle-beam projection processing apparatus for irradiating a target by means of a beam of energetic electrically charged particles, comprising:

an illumination system for generating and forming said energetic particles into an illuminating beam, a pattern definition means located after the illumination system as seen along the direction of the beam, said pattern definition means being adapted to position an aperture pattern composed of apertures transparent to the energetic particles in the path of the illuminating beam, thus forming a patterned beam emerging from the aperture pattern, and a projection system positioned after the pattern definition means and adapted to project the patterned beam onto a target to be positioned after the projection system, the projection system comprising at least two consecutive projector stages, namely, at least one non-final projector stage forming an intermediate stage and one final projector stage, further comprising at least one foil located across the path of the patterned beam, said at least one foil being positioned between the pattern definition means and the position of the target at a location close to a respective image of the aperture pattern formed by the projection system, a first foil of the at least one foil being located before a consecutive projector stage of the projection system.

2. The apparatus of claim 1, wherein a second foil of the at least one foil is located in front of the position of the target as seen along the direction of the beam.

3. The apparatus of claim 2, wherein the at least one foil is adapted to be held at an electrical potential, thus forming a final electrode of the projection system.

4. The apparatus of claim 3, wherein the at least one foil is sufficiently thin to allow unimpeded propagation of a fraction of the irradiating beam through the at least one foil.

5. The apparatus of claim 2, wherein the at least one foil is sufficiently thin to allow unimpeded propagation of a fraction of the irradiating beam through the at least one foil.

6. The apparatus of claim 1, further comprising an aperture diaphragm located after the at least one foil as seen along the direction of the beam, said diaphragm having an aperture limiting the lateral extension of the beam.

7. The apparatus of claim 6, wherein the at least one foil is sufficiently thin to allow unimpeded propagation of a fraction of the irradiating beam through the at least one foil.

8. The apparatus of claim 1, wherein the at least one foil is sufficiently thin to allow unimpeded propagation of a fraction of the irradiating beam through the foil.

9. The apparatus of claim 1, wherein the at least one foil separates two adjacent recipients held at different gas pressures.

10. The apparatus of claim 1, wherein the at least one foil is continuous across the area of the respective image of the aperture pattern.

11. The apparatus of claim 1, wherein the at least one foil is made from an electrically conductive material.

12. The apparatus of claim 1, wherein the at least one foil is made from a semiconductor material.

13. The apparatus of claim 12, wherein the semiconductor material is silicon or diamond-like carbon.

14. The apparatus of claim 1, comprising a sensor means adapted to monitor the integrity of the at least one foil and a mechanical shutter means located near an opening for the patterned beam within the apparatus and being adapted to close said opening upon detection of a damage to the at least one foil by said sensor means.

15. The apparatus of claim 1, wherein the at least one foil is sufficiently thin to allow unimpeded propagation of a fraction of the irradiating beam through the at least one foil.

* * * * *